(12) United States Patent
Kalina

(10) Patent No.: US 8,123,405 B2
(45) Date of Patent: Feb. 28, 2012

(54) PROGRAMMABLE CIRCUIT FOR DRIFT COMPENSATION

(75) Inventor: Roger J. Kalina, San Diego, CA (US)

(73) Assignee: BAE Systems Information Solutions Inc., Arlington, VA (US)

( * ) Notice: Subject to any disclaimer, the term of this patent is extended or adjusted under 35 U.S.C. 154(b) by 443 days.

(21) Appl. No.: 12/160,522

(22) PCT Filed: Jun. 21, 2007

(86) PCT No.: PCT/US2007/071738
§ 371 (c)(1),
(2), (4) Date: Jul. 10, 2008

(87) PCT Pub. No.: WO2007/149959
PCT Pub. Date: Dec. 27, 2007

(65) Prior Publication Data
US 2009/0315607 A1  Dec. 24, 2009

(51) Int. Cl.
*G01K 7/02* (2006.01)
(52) U.S. Cl. ...................................................... 374/179
(58) Field of Classification Search ............... 33/179, 33/180, 181, 182
See application file for complete search history.

(56) References Cited

U.S. PATENT DOCUMENTS 2,742,786 A * 4/1956 Lemmerman ................. 374/181
(Continued)

OTHER PUBLICATIONS

PCT, International Search Report Mailed Sep. 15, 2008.
(Continued)

*Primary Examiner* — G. Bradley Bennett
(74) *Attorney, Agent, or Firm* — Cooley LLP

(57) ABSTRACT

Systems and methods relating to programmable circuits are described. Several embodiments relate to systems and methods for controlling the long-term stability and accuracy of circuits that produce waveforms varying in frequency and amplitude. Such embodiments may include a circuit comprising a common vacuum environment that houses a pair of heater-thermocouples. The circuit may compare signals outputted by each heater-thermocouple and then may produce a resultant value based on the comparison. The resultant value may be used by the circuit to control the long-term stability and accuracy of the circuit. Such control of the long-term stability and accuracy of the circuit may include drift compensation associated with certain components of the circuit.

17 Claims, 7 Drawing Sheets

U.S. PATENT DOCUMENTS

| | | | |
|---|---|---|---|
| 2,745,053 | A | 5/1956 | Meyer |
| 3,758,830 | A | 9/1973 | Jackson |
| 4,133,700 | A * | 1/1979 | Hollander et al. ............ 374/181 |
| 4,441,071 | A * | 4/1984 | Houseman .................... 374/181 |
| 4,475,103 | A | 10/1984 | Brokow et al. |
| 5,351,551 | A | 10/1994 | Drubetsky et al. |
| 7,175,343 | B2 * | 2/2007 | Phillips ........................ 374/180 |
| 2007/0286255 | A1 * | 12/2007 | Toyoshima ................... 374/179 |
| 2010/0282163 | A1 * | 11/2010 | Aggarwal et al. ............. 374/179 |

OTHER PUBLICATIONS

PCT Application PCT/US2007/071738 International Preliminary Report on Patentability.

PCT Application PCT/US2007/071738 Written Opinion.

* cited by examiner

PROGRAMMABLE CIRCUIT FOR DRIFT COMPENSATION

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates to systems and methods that implement one or more programmable circuits. In particular, but not by way of limitation, the present invention relates to systems and methods for controlling long-term stability and accuracy of circuits that produce waveforms varying in frequency and amplitude.

BACKGROUND OF THE INVENTION

Numerous applications find it useful to control characteristics of output waveforms provided by various types of circuits, especially applications where extreme accuracy and long-term stability is desired or necessary. Critical circuit function in such applications is greatly impacted by variations in component performance. For example, the performance characteristics of amplifiers may vary due to errors resulting from drift of offset and gain. Such errors may restrict the frequency range, impair the accuracy and stability, and slow the response time of circuitry.

One previously known approach of compensating for errors caused by drift centers upon controlling the entire collection of components in a circuit. This method typically employs circuit designs that use components with exceptional qualities. Unfortunately, an undesirable consequence of this method is increased cost, as components of exceptional quality are generally expensive. An additional consequence of this method is that it relies on careful selection of all components to regulate overall performance of the circuit. As a circuit becomes more complex, the number of components increases, which results in a greater chance of error. While this approach of controlling circuit component selection can compensate for error, it does so without minimizing expense and risk exposure inherent in circuits with many components.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention provides a system and method capable of controlling an output of a circuit. In a first exemplary embodiment, the present invention comprises circuitry operating within a common vacuum environment. The circuitry in one implementation of the first exemplary embodiment comprises two heater-thermocouples. Each heater-thermocouple includes a pair of inputs and a pair of outputs. The heater in a specific heater-thermocouple is connected to the pair of inputs, and the thermocouple in that specific heater-thermocouple is connected to the pair of outputs.

In another exemplary embodiment, the present invention comprises circuitry including a signal source and a comparator that includes a common vacuum environment. The comparator comprises two inputs, and one output. A signal source produces a source signal, and signals related to the source signal are received by the two inputs. The comparator compares the signals received by the two inputs, and the output produces an output signal based on the comparison. The signal source operates on the output signal in order to adjust the output signal.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

One aspect of the present invention contemplates a circuit design that includes a differential heater-thermocouple pair housed within a common vacuum environment. Another aspect of the present invention contemplates a circuit design that compensates for drift in offset and gain of the common vacuum environment and/or one or more other circuit components. Several embodiments of the present invention describe the use of the above two aspects in different circuit designs; however, these embodiments are not intended to be exhaustive of circuit designs capable of employing the above two aspects.

Figure 1:
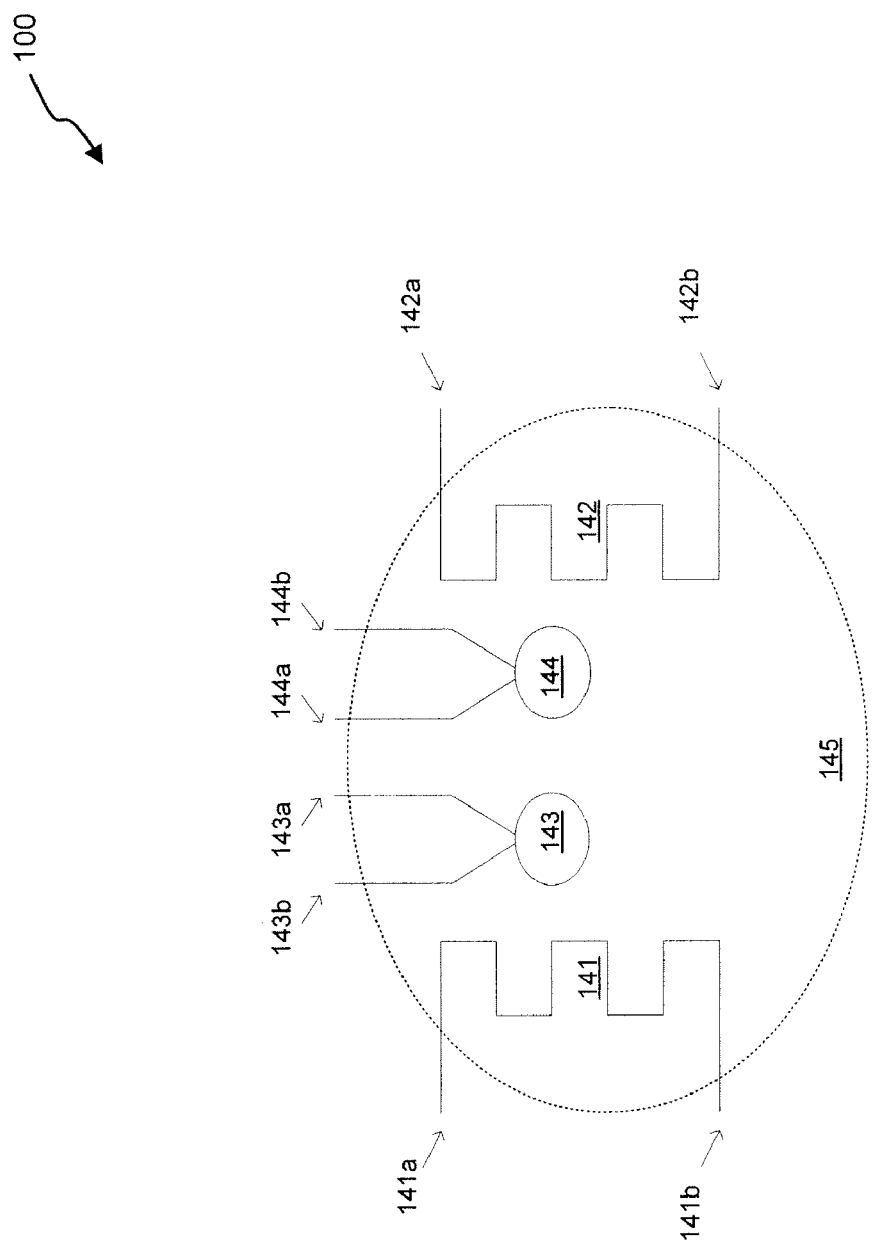
FIG. 1 depicts a block diagram of a circuit in accordance with one embodiment of the present invention.

Referring now to the drawings, where like or similar elements are designated with identical reference numerals throughout the several views, and referring in particular to FIG. 1, a block diagram of circuitry 100 in one exemplary embodiment is illustrated.

As shown, circuitry 100 comprises two heaters 141 and 142, and two thermocouples 143 and 144, all of which are housed within a common vacuum environment 145. As described below, the common vacuum environment 145 is defined by, for example, a single glass envelope (not shown). Heater 141 is thermally connected to thermocouple 143, thus creating a heater-thermocouple 141/143. Heater 142 is thermally connected to thermocouple 144, thus creating a heater-thermocouple 142/144. Included in the circuitry 100 are leads 141a, 141b, 142a, 142b, 143a, 143b, 144a and 144b. Leads 141a and 141b are connected to heater 141, and leads 142a and 142b are connected to heater 142. Thermocouple 143 is connected electronically to leads 143a and 143b, and thermocouple 144 is connected electronically to leads 144a and 144b. In several embodiments leads 141b, 142b, 143b and 144b are connected to ground (not shown); however embodiments of the present invention are by no means limited to such a configuration.

The vacuum characteristics of the common vacuum environment 145 are advantageous in that the gain of each heater-thermocouple 141/143 and 142/144 remains relatively constant with respect to the other on a short term basis. If the heater-thermocouples 141/143 and 142/144 were to be housed in separate glass envelopes (i.e., separate vacuum environments), their gains would likely differ significantly as a function of temperature. Thus, in order to ensure that each heater-thermocouple 141/143 and 142/144 operates in an identical environment, certain embodiments of the present invention place both pairs in the same evacuated glass envelope.

In several embodiments of the present invention, other compensation circuitry (not shown) is provided that is not included within the common vacuum environment 145. In these embodiments, thermocouples 143 and 144 each produce a signal that is released by leads 143a and 144a, respectively. The produced signals are then operated on by such other circuitry to compensate for long-term drift in the common vacuum environment 145 and/or in one or more additional components in the circuitry. In one of these embodiments, the operation on the signals released by the leads 143a and 144a is a comparison of those released signals. Based on the comparison, compensation for drift in the common vacuum environment 145 and/or in the one or more additional components may occur.

It is noted that the use of thermocouples in this embodiment offers a cost effective solution to applications such as true RMS voltage measurement and leveling in many environments over wide temperature ranges; however, the scope and spirit of several embodiments of the present invention is not limited to the implementation of heater-thermocouples. One of skill in the art will appreciate alternatives to using heater-thermocouples while remaining within both the scope and the spirit of the present invention.

Figure 2:
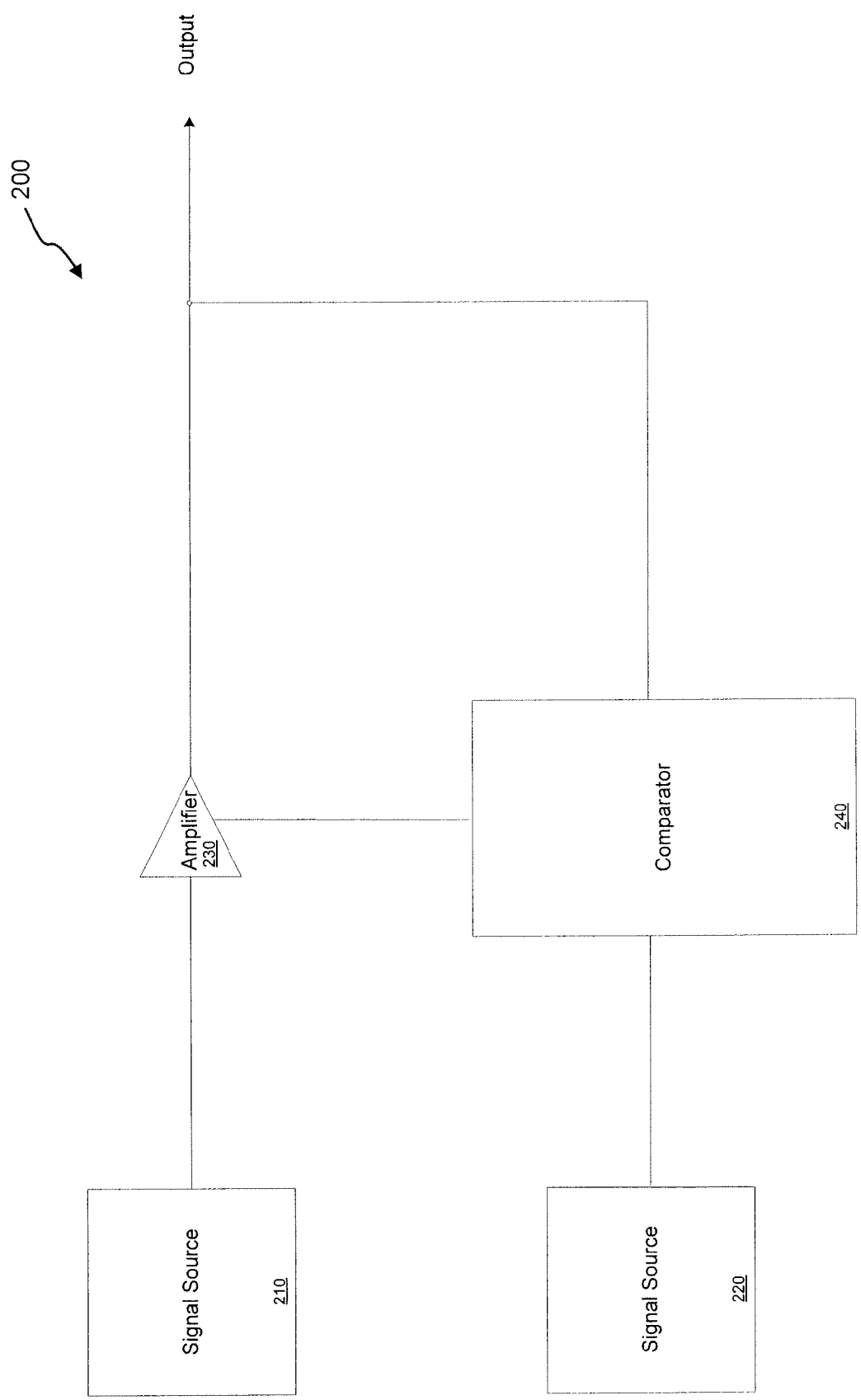
FIG. 2 depicts a block diagram of a circuit in accordance with another embodiment of the present invention.

Attention is now drawn to FIG. 2, which depicts a block diagram of a circuit 200 in accordance with one embodiment of the present invention. As shown, the circuit 200 of FIG. 2 includes signal sources 210 and 220, an amplifier 230 and a comparator 240.

According to FIG. 2, the signal source 210 outputs a signal to the amplifier 230. The signal outputted by the signal source 210 may be any type of signal at any desired frequency. Once the amplifier 230 receives the signal outputted by the signal source 210, an amplified signal is outputted by the amplifier 230. Amplification parameters are described in more detail in the following paragraph.

The signal source 220 and the comparator 240 are configured to control the amplitude of an output of the circuit 200. As shown, the comparator 240 receives two signals, including one signal from the signal source 220, and a feedback signal from the amplifier 230. The comparator 240 compares these two signals and outputs a signal based on the comparison. The signal outputted by the comparator 240 operates on the amplifier 230 to control the amplification of the signal received by the amplifier 230 from the signal source 210. The outputted signal of the comparator 240 adjusts the amplification of the amplifier 230 until the two inputs into the comparator 240 are equal or within a specified difference.

Figure 3:
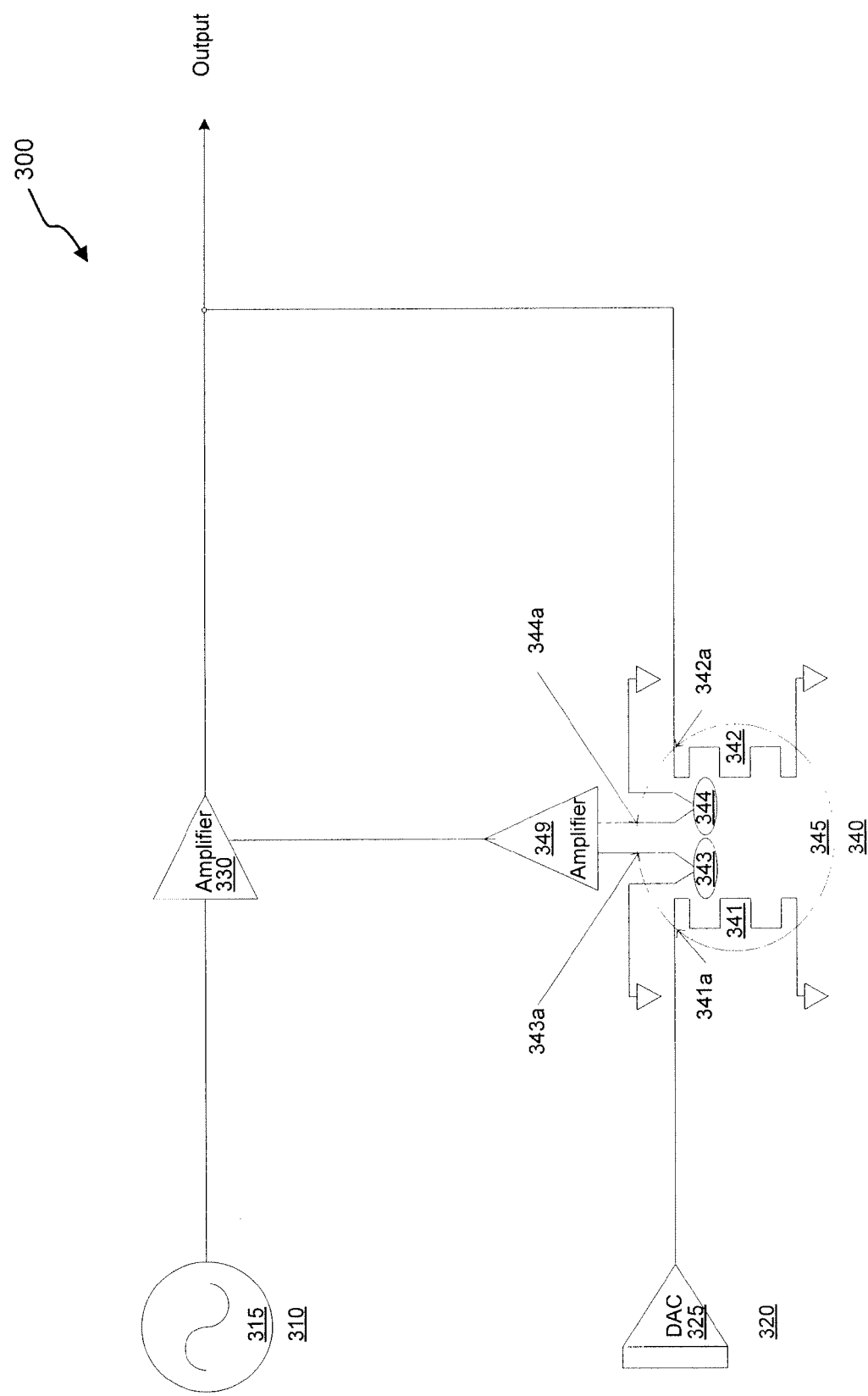
FIG. 3 depicts a more-detailed block diagram of the circuitry depicted with respect to FIG. 2.

Attention is now drawn to FIG. 3, which provides a schematic view of a circuit 300 corresponding to a particular implementation of the circuit 200 of FIG. 2. While referring to FIG. 3, simultaneous reference will be made to FIG. 2 and FIG. 1.

As shown, a signal source 310 includes a frequency synthesizer 315 (e.g., a direct digital synthesis frequency synthesizer) and a signal source 320 includes a digital-to-analog converter ("DAC") 325. A comparator 340 includes a common vacuum environment 345 and an amplifier 349 (e.g., a precision ultra-low-drift operational amplifier that functions as an error amplifier). In this embodiment, the common vacuum environment 345 is configured in the same manner in which the common vacuum environment 145 is configured. Thus, the functions of the common vacuum environment 145 are applicable to the common vacuum environment 345.

According to FIG. 3, a servo loop is formed by applying a signal (e.g., a direct current ("DC") or an alternating current ("AC") signal from the DAC 325) to the lead 341a of the common vacuum environment 345, and another signal (e.g., a DC or an AC signal) to the lead 342a of the common vacuum environment 345. After the leads 341a and 342a receive their respective signals, the leads 343a and 344a of the common vacuum environment 345 each output a signal to the amplifier 349. In this case, the two output signals released by the leads 343a and 344a are each based on a different one of the signals received by the leads 341a and 342a. The amplifier 349 compares the two output signals received from the leads 343a and 344a, and releases its own output signal to amplifier 330. In accordance with one aspect of the invention, output signal is then operated upon in the circuit 300 to compensate for drift of offset and gain that exists in one or more of the components in the circuit 300.

For example, in one embodiment the output of the amplifier 349 may adjust the gain of an amplifier 330 (e.g., a variable gain amplifier) until the two output signals released by the leads 343a and 344a are equal/within a specified difference or until the servo loop is balanced. At this point, the true root-mean-square ("RMS") value of the DC/AC signal applied to the lead 341a of the common vacuum environment 345 is equal to or within a specified difference of the DC/AC signal applied to the lead 342a of the common vacuum environment 345.

In another example, the output of the amplifier 349 may be used to compensate for minor drift in the thermocouple 343 of the common vacuum environment 345. In yet another example, the output of the amplifier 349 may be used to compensate for drift created by connections in the circuit 300, including possible thermal EMF created by solder joints. These examples are included only to illustrate some of the potential components in the circuit 300 that may cause drift. Moreover, these examples are not intended to limit the scope of the present invention.

In one embodiment, the frequency synthesizer 315 comprises a direct digital synthesis ("DDS") frequency synthesizer from which the frequency of an output of the circuit 300 is derived. The true RMS amplitude of the output of the circuit 300 is programmed by a direct current output of precision signals from the DAC 325. These required signals could be applied and measured by means other than the DDS frequency synthesizer 315 and the DAC 325 as discussed here; however, their use enables a micro-processor interface to allow for some automation of operation.

Another important consideration and feature of the present invention is a means to compensate for minor-order drifts with time and various environmental changes such as temperature. Regarding the drift compensation feature, attention is now drawn to FIG. 4, which depicts a block diagram of an exemplary drift compensation circuit 400.

Figure 4:
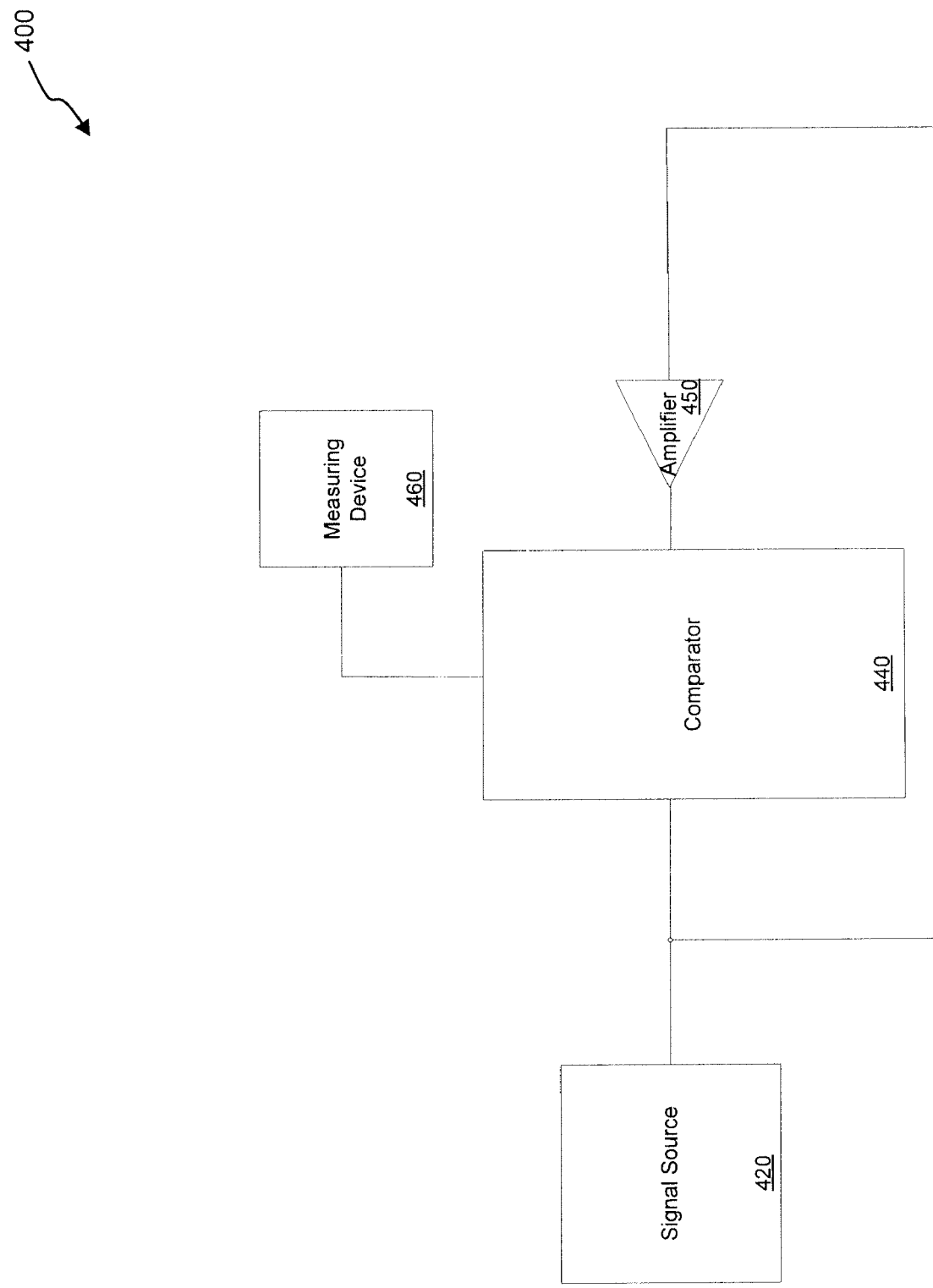
FIG. 4 depicts a block diagram of a circuit in accordance with yet another embodiment of the present invention.

As shown, FIG. 4 includes a signal source 420, a comparator 440, an amplifier 450 and a measurement device 460. The signal source 420 outputs a signal (e.g., a DC or an AC signal) that is received by the comparator 440 and the amplifier 450. The signal received by the amplifier 450 is amplified or attenuated and then outputted to the comparator 440.

The comparator 440 receives two signals including a first signal directly from the signal source 420 and a second signal from the amplifier 450. The comparator 440 compares the first and second signals and outputs a signal based on the comparison, which is received by the measuring device 460.

Upon receiving the signal outputted by the comparator 440, the measuring device 460 determines whether minor-order drift(s) exist with respect to the amplifier 450 and/or other devices in the circuit 400 (if applicable). If the measuring device 460 determines that drift exists, the signal source 420 is notified and the signal outputted by the signal source 420 is adjusted to compensate for drift.

Figure 5:
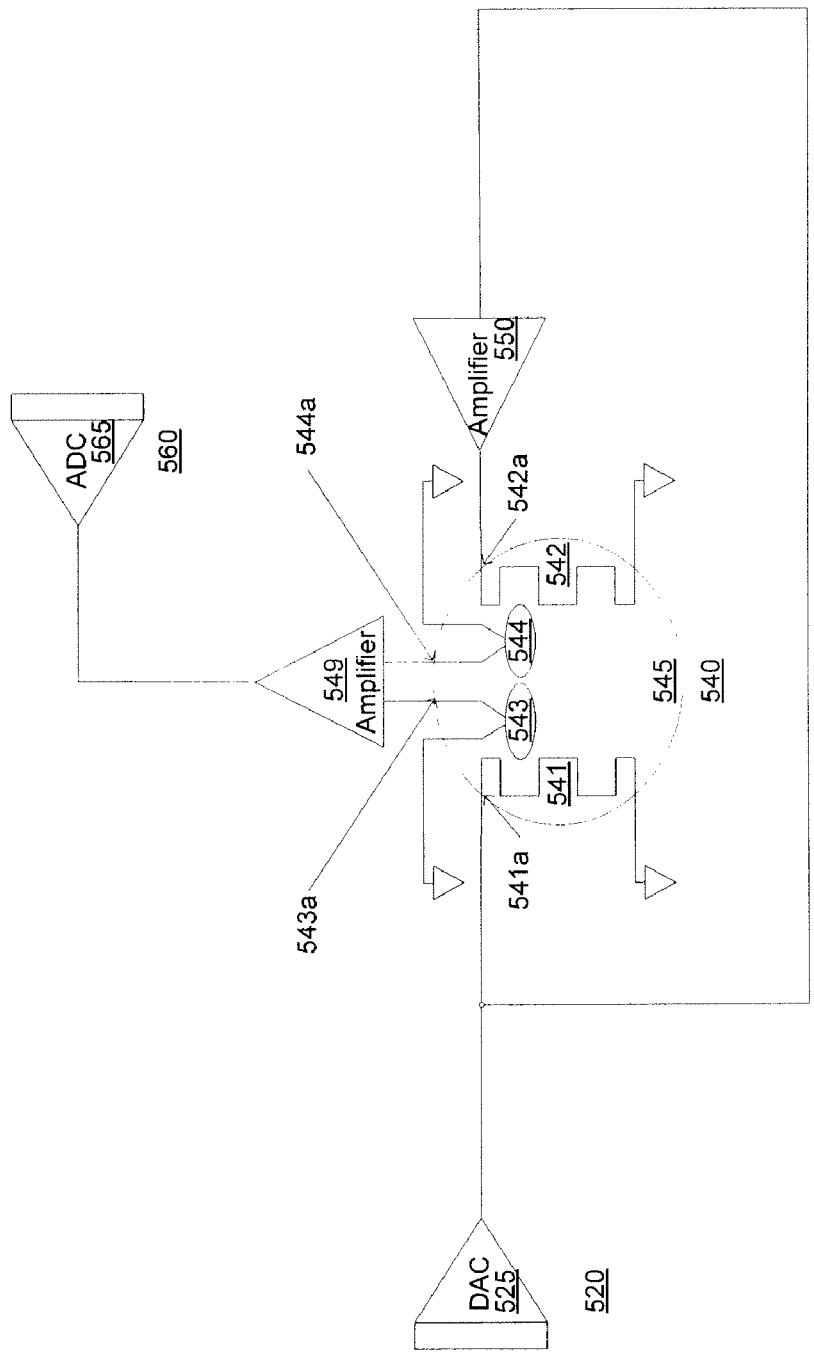
FIG. 5 depicts a more-detailed block diagram of the circuitry depicted with respect to FIG. 4.

Attention is now drawn to FIG. 5, which provides a schematic view of a circuit 500 corresponding to a particular implementation of the circuit 400 of FIG. 4. While referring to FIG. 5, simultaneous reference will be made to FIG. 4, FIG. 3 and FIG. 1.

As shown, a signal source 520 includes a digital-to-analog converter ("DAC") 525, a comparator 540 includes a common vacuum environment 545 and an amplifier 549, and a measuring device 560 includes an analog-to-digital converter ("ADC") 565 that is configured to maintain critical circuit functionality. Both the common vacuum environment 545 and the amplifier 549 are similar in structure to the common vacuum environment 345 and the amplifier 349, respectively, the descriptions of which are applied to this discussion of FIG. 5.

Except as otherwise indicated below, the circuit shown in FIG. 5 functions identically to the circuit described above with respect to FIG. 4. As shown in FIG. 5, the DAC 525 produces a signal (e.g., a DC or an AC signal) that is received directly by the lead 541a of the common vacuum environment 545 and indirectly, via an amplifier 550, by the lead 542a of the common vacuum environment 545. After the leads 541a and 542a receive their respective signals, the leads 543a and 544a of the common vacuum environment 545 each output a signal to the amplifier 549. In this case, the two output signals released by the leads 543a and 544a are each based on a different one of the signals received by the leads 541a and 542a. The amplifier 549 compares the two output signals received from the leads 543a and 544a, and releases its own output signal that is then operated upon in the circuit 500 to compensate for any drift of offset and gain that exists in any of the components of circuit 500.

Since the signal output from the DAC 525 is essentially applied to both sides of the common vacuum environment 545 equally, the output signal of the amplifier 549 should indicate no difference in voltage between the heater-thermocouple pair 541/543 and 542/544 of the common vacuum environment 545.

If the output of the amplifier 549 indicates a difference in voltage between the heater-thermocouple pair 541/543 and 542/544 of the common vacuum environment 545, then the ADC 565 will receive this information and adjust the DAC 525 accordingly to balance the two sides of the common vacuum environment 545.

Figure 6:
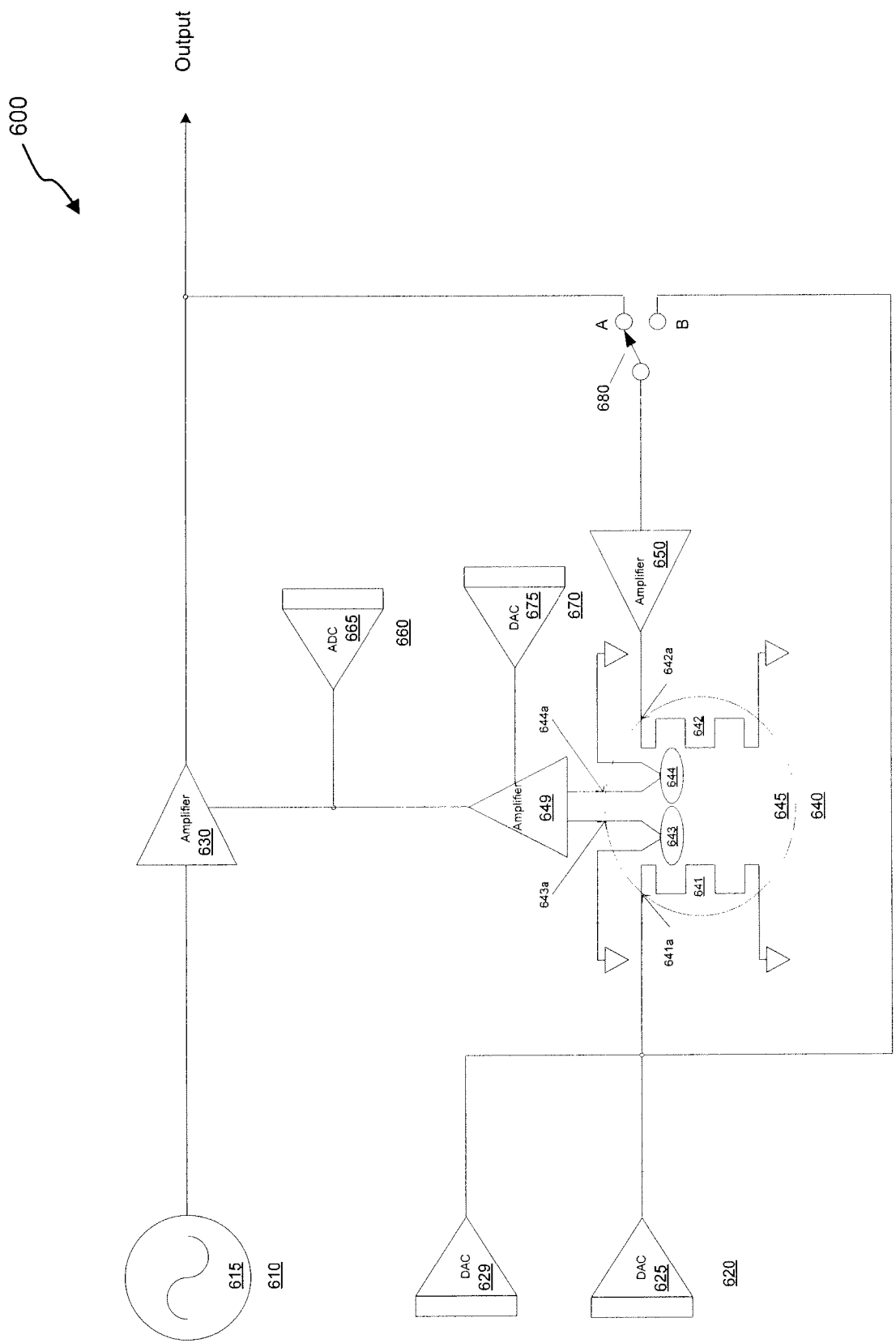
FIG. 6 depicts a block diagram of a circuit in accordance with yet another embodiment of the present invention.

Attention is now drawn to FIG. 6, which is a block diagram of a circuit 600 in accordance with an exemplary embodiment of the present invention that combines the functionalities and components described with respect to FIGS. 1-5. As shown, the circuit 600 includes signal sources 610, 620 and 670, amplifiers 630 and 650, a comparator 640, a measuring device 660 and a switch 680. The switch 680 can be positioned at position A to effect one feature of the present invention and at position B to effect another feature of the present invention.

One feature of the circuitry shown in FIG. 6 is to provide a precision output of the circuit 600, programmable in both frequency and amplitude. In this case the switch 680 is positioned at position A. The frequency of the output of the circuit 600 is derived from the signal source 610 (e.g., a direct digital synthesis ("DDS") frequency synthesizer 615). The true root-mean-square ("RMS") amplitude of the output of the circuit 600 is programmed by the signal source 620 (e.g., a digital-to-analog converter ("DAC") 625 and a Vernier DAC 629). These signals could be applied by means other than the DDS frequency synthesizer 615, the DAC 625 and the Vernier DAC 629 as discussed here; however, their use enables a microprocessor interface to allow for some automation of operation.

One focal point of the circuit 600 is a common vacuum environment 645 configured similarly to the common vacuum environment 145 of FIG. 1, the description of which is applied to this discussion of FIG. 6. The common vacuum environment 645 is connected to an amplifier 649 (e.g., a precision ultra-low-drift operational amplifier that functions as an error amplifier).

A servo loop is formed by applying a first signal (e.g., a precision DC or AC signal) from the signal source 620 to the lead 641a of the common vacuum environment 645, and a second signal (e.g., a DC or AC signal) to the lead 642a of the common vacuum environment 645. After the leads 641a and 642a receive their respective signals, the leads 643a and 644a of the common vacuum environment 645 each output a signal to the amplifier 649. In this case, the two output signals released by the leads 643a and 644a are each based on a different one of the signals received by the leads 641a and 642a. The amplifier 649 compares the two output signals received from the leads 643a and 644a, and releases its own output signal based on differences in voltage between the heater-thermocouple pair 641/643 and 642/644 of the common vacuum environment 645. The output signal released by the amplifier 649 is then operated upon in circuit 600 to compensate for drift of offset and gain that exists in one or more of the components in circuit 600.

For example, the output of the amplifier 649 is operated upon to adjust the gain of the amplifier 630 (e.g., a variable gain amplifier) until the voltages of the heater-thermocouples 641/643 and 642/644 are equal and the servo loop is balanced. At this point, the true RMS value of the second signal applied to the lead 642a of the common vacuum environment 645 is equal to the first signal applied to the lead 641a of the common vacuum environment 645. Additionally, the true RMS amplitude of the output of circuit 600 is related to the value of the second signal by the gain or attenuation of the amplifier 650.

As described before with respect to FIG. 1, an important consideration and feature of the common vacuum environment 645 used in several embodiments of the present invention is that the gain of each heater-thermocouple 641/643 and 642/644 remains relatively constant with respect to each other on a short term basis. If the heater-thermocouples 641/643 and 642/644 were to be housed in separate glass envelopes, their gains would differ significantly as a function of temperature. Thus, in order to ensure that each heater-thermocouple 641/643 and 642/644 operates in an identical environment, embodiments of the invention place both heater-thermocouple units in the same evacuated glass envelope.

Another feature of this invention is a means to compensate for inevitable minor-order drifts with time of offset and gain in the common vacuum environment 645 and/or the sensitive servo loop circuitry (e.g., the amplifier 650 and/or one or more solder joints). This drift compensation is necessary in order to achieve high accuracy and long-term stability, and is accomplished by utilizing the measuring device 660 (e.g., an analog-to-digital converter ("ADC") 665), the signal source 670 (e.g., an offset DAC 675), and the signal source 620.

The offset and gain stabilization operation is initiated by moving the switch 680 to position B. This serves to apply the current-summed output signal from the DAC 625 and the Vernier DAC 629 to both sides of the common vacuum environment 645. Serving only as an example, the amplifier 650 is included in the circuitry 600 in order to compensate for any drifts associated with the amplifier 650. One of skill in the art will recognize other components that may be included in place of or in addition to the amplifier 650.

Initially, both the DAC 625 and the Vernier DAC 629 are programmed to zero. Under this condition, the output of the offset DAC 675 is programmed to a level such that the ADC 665, which is connected to the output of the amplifier 649, measures a known reference voltage. One of ordinary skill in the art will appreciate that the exact reference voltage value is not important and may depend on the particular output stage design of the amplifier 649.

Next, while still applying the offset DAC 675 value, the DAC 625 output is adjusted to provide the full scale deviation of the common vacuum environment 645. The ADC 665 will measure the output signal of the amplifier 649. If the ADC 665 does not measure the same reference voltage as described above, the Vernier DAC 629 is adjusted until the ADC 665 measures the same reference voltage as described above.

As a consequence of these measurements and adjustments, the offset and gain characteristics of circuit 600 are restored to the same reference value within the capability of the ADC 665. When the switch 680 is restored to position A, the offset DAC 675 and the Vernier DAC 629 remain set to the values established during the operation phase of position B. The flipping of the switch 680 from position A to position B is performed after temperature stability is achieved in position A, and thereafter incrementally (e.g., on a time basis of seconds, hours, days, weeks, months, or years) or upon the happening of some event.

Figure 7:
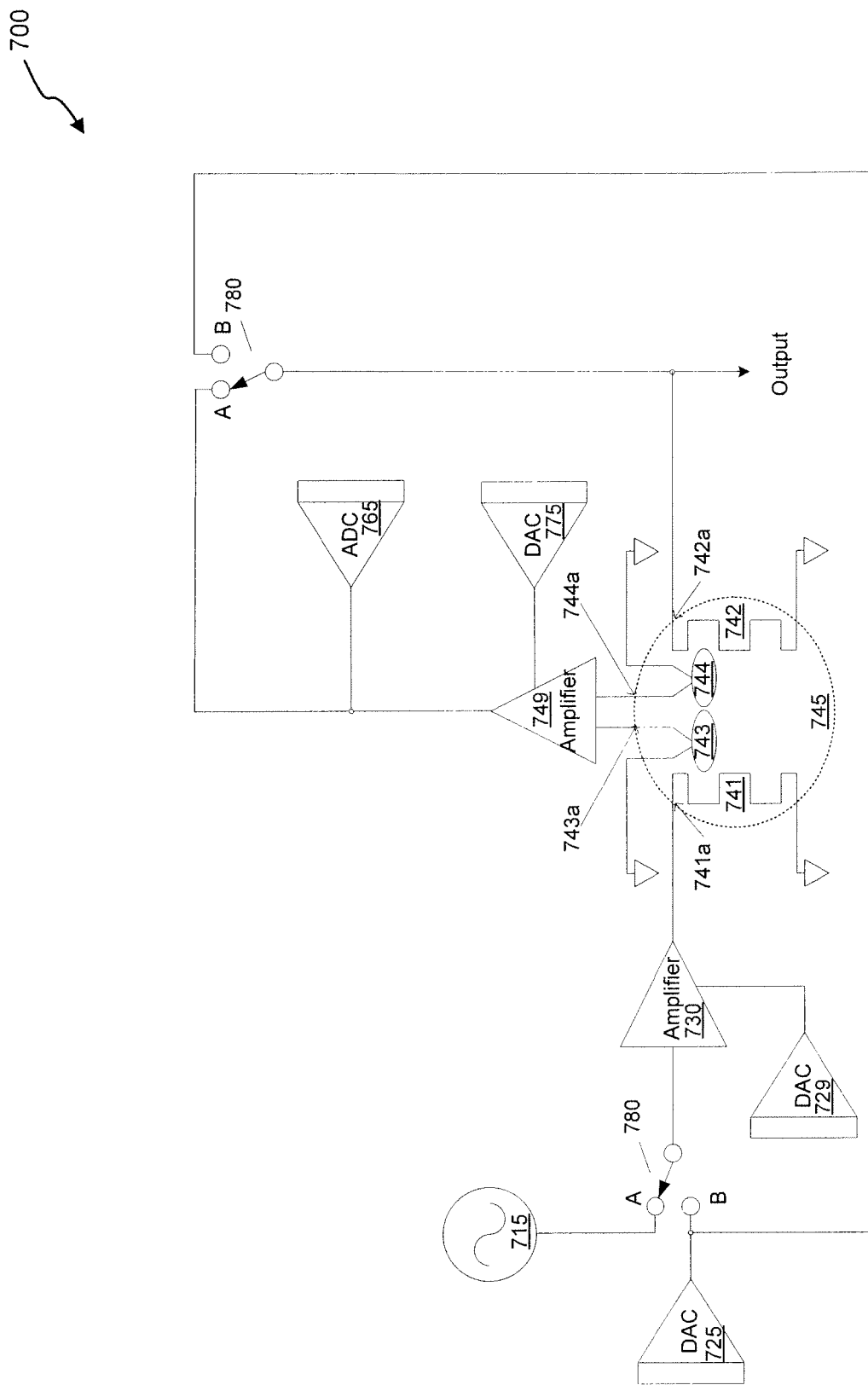
FIG. 7 depicts a block diagram of a circuit in accordance with yet another embodiment of the present invention.

Alternative embodiments of the present invention may include different configurations of circuit design. In one such embodiment, as depicted in FIG. 7, a circuit 700 can be realized by reconfiguring the circuit design of FIG. 6. The components shown for FIG. 7 are for illustrative purposes only. One of skill in the art will appreciate alternative embodiments of FIG. 7 comprising fewer or more components that shown in FIG. 7.

As shown, the circuit 700 comprises signal sources 715, 725, 729 and 775, amplifiers 730 and 749, a common vacuum environment 745, a measurement device 765 and switches 780. The switches 780 are configured to switch from position A to position B and from position B to position A.

When the switches 780 are in position B, the signal source 725 (e.g., a digital-to-analog converter) and the signal source 729 (e.g., a Vernier digital-to-analog converter) are set to zero, while the signal source 775 (e.g., a digital-to-analog converter) is adjusted to produce some arbitrary reference value (e.g., 200 mV) which is read by the measurement device 765 (e.g., an analog-to-digital converter). The exact value produced by the signal source 775 and measured by 765 will become the reference for all future adjustments; however, the actual value serving as the reference is unimportant so long as it is within the range configured for the amplifier 749 and it remains unchanged.

Once the reference value of the circuit 700 is set, the signal source 725 releases a signal representing a full-scale deviation of the common vacuum environment 745 that is sent to two heaters 741 and 742 (e.g., similar to the heaters 141 and 142 of FIG. 1) of the common vacuum environment 745. Before reaching the heater 741, the signal passes through the amplifier 730. The signals received by the heater 741 and the heater 742 are each thermally converted. The thermally converted signals from heaters 741 and 742 are received by thermocouples 743 and 744, respectively (e.g., similar to the thermocouples 143 and 144 of FIG. 1). A comparison of the resulting thermocouple values is performed by the amplifier 749, which outputs a signal based on the comparison. The signal outputted by the amplifier 749 is then received by the measuring device 765. Since the signal from the signal source 725 is applied to both sides of the common vacuum environment 745, the output as represented by the amplifier 749 should be the same as the reference value. If the measurement taken by the measuring device 765 does not measure the reference value, then the signal source 729, which operates on the amplification of amplifier 730, is adjusted until the measurement device 765 measures the reference value (which is still applied by the operation of signal source 775). This adjustment compensates for drift in the circuit 700.

When the switches 780 are in position A, the signal source 729 (which adjusts amplification of the amplifier 730) and the signal source 775 are maintained consistent with the adjustment made in the manner described above with respect to position B. The signal source 715 outputs a signal that is received by the amplifier 730 and a resulting amplified signal is sent from the amplifier 730 to the heater 741. A thermal conversion of this signal is received by the thermocouple 743, which is electronically connected to the amplifier 749. A feedback signal generated by the amplifier 749 is received by the heater 742, and a thermal conversion of this feedback signal is thermodynamically communicated to the thermocouple 744, which is electronically connected to the amplifier 749.

At this point, the amplifier 749 compares the values of the thermocouples 743 and 744 and outputs a signal indicative of the result of the comparison. When the servo loop created by the feedback signal is balanced, the output of the amplifier 749 will be equivalent to the root-mean-square value of the signal outputted by the signal source 715.

In conclusion, the present invention provides, among other things, a system and method for controlling the long-term stability and accuracy of circuitry that can be used to control an output waveform or used as a measurement device. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A compensation system, comprising:
a structure defining a common vacuum environment; and
a compensation arrangement disposed within the common vacuum environment, the arrangement including:
  a first input that delivers first signal to a first heater wherein the first heater is thermally connected to a first thermocouple;
  a second input that delivers a second signal to a second heater, wherein the second heater is thermally connected to a second thermocouple;
  a first output that outputs a third signal received from the first thermocouple; and
  a second output that outputs a fourth signal received from the second thermocouple.

2. The system of claim 1, further comprising:
a first component that compares the third signal with the fourth signal and produces a fifth signal based on the comparison between the third signal and the fourth signal; and
a second component that operates upon the fifth signal to compensate for drift associated with a third component.

3. The system of claim 2, wherein the second component is a signal source.

4. The system of claim 2, wherein the third component is disposed within the common vacuum environment.

5. The system of claim 2, wherein the third component is a circuit connection that generates thermal EMF errors.

6. The system of claim 2, wherein the third component is a non-ideal amplifier.

7. The system of claim 2, wherein the third component is a heater-thermocouple.

8. The system of claim 2, wherein the first component is an error amplifier comprising a first error amplifier input, a second error amplifier input and an error amplifier output, wherein the first error amplifier input is operable to receive the third signal, wherein the second error amplifier input is operable to receive the fourth signal, and wherein the error amplifier output is operable to output the fifth signal.

9. A system including circuitry, comprising:
a signal source that produces a source signal;
a comparator having a first input, a second input and an output, wherein the first input receives a first signal, wherein the second input receives a second signal, and wherein the output produces an output signal based on a comparison between the first signal and the second signal; and
a measurement device that measures the output signal produced by the comparator to achieve a measurement value, wherein the signal source adjusts the output signal of the comparator in response to the measurement value.

10. The system of claim 9, wherein the first signal is derived from the signal source, and wherein the second signal is derived from the signal source.

11. The system of claim 9, wherein the first signal is derived from the signal source, and wherein the second signal is derived from the output of the comparator.

12. The system of claim 9, wherein the adjustment of the output signal compensates for drift of a system component.

13. The system of claim 9, wherein the comparator comprises a common vacuum environment including a first thermocouple and a second thermocouple.

14. The system of claim 12, wherein the system component is a common vacuum environment including a first thermocouple and a second thermocouple.

15. The system of claim 12, wherein the system component is a circuit connection that generates thermal EMF errors.

16. The system of claim 12, wherein the system component is a non-ideal amplifier.

17. The system of claim 12, wherein the system component is a heater-thermocouple.

* * * * *